United States Patent [19]
Ono

[11] Patent Number: 5,796,147
[45] Date of Patent: Aug. 18, 1998

[54] SEMICONDUCTOR DEVICE HAVING A PLURALITY OF CIRCUITS DRIVEN BY DIFFERENT POWER SOURCES AND FORMED ON THE SAME SUBSTRATE

[75] Inventor: Masayoshi Ono, Yokohama, Japan

[73] Assignee: Kabushiki Kaisha Toshiba, Kawasaki, Japan

[21] Appl. No.: 288,188

[22] Filed: Aug. 9, 1994

[30] Foreign Application Priority Data

Aug. 9, 1993 [JP] Japan .................................. 5-197350

[51] Int. Cl.$^6$ ........................................... H01L 23/62
[52] U.S. Cl. ......................... 257/355; 257/368; 257/369
[58] Field of Search ............................ 257/368, 369, 257/355

[56] References Cited

PUBLICATIONS

1989 IEEE International Solid–State Circuits Conference, by Fujii et al., pp. 248–249, Dec. 1989.

*Primary Examiner*—Mark V. Prenty
*Attorney, Agent, or Firm*—Oblon, Spivak, McClelland, Maier & Neustadt, P.C.

[57] ABSTRACT

A semiconductor device has a semiconductor substrate including at least a first well and a second well which is electrically divided each other; a first electric circuit formed in the first well and connected to a first circuit power source through a source terminal; a second electric circuit formed in the second well and connected to a second circuit power source through a source terminal; a substrate ground well formed on the semiconductor substrate and connected to a third circuit power source which outputs a stable reference potential; a first protection diode connected between the source terminal of the first power source and the substrate ground well in the manner of being a reverse bias direction; and a second protection diode connected between the source terminal of the second power source and the substrate ground well in the manner of being a reverse direction.

13 Claims, 8 Drawing Sheets

SEMICONDUCTOR DEVICE HAVING A PLURALITY OF CIRCUITS DRIVEN BY DIFFERENT POWER SOURCES AND FORMED ON THE SAME SUBSTRATE

BACKGROUND OF THE INVENTION

The present invention relates to a semiconductor device having a plurality of wells on which circuit elements are formed, more particularly, to an improvement of a semiconductor device having a circuit for protecting an electric static discharge (ESD) of an electric circuit formed on the wells.

One of semiconductor devices has a plurality of power sources corresponding to each of circuits. For example, a digital-analog large scale integrated circuit (LSI) has both digital circuits and analog circuits formed on the same semiconductor substrate. In the digital-analog LSI, the semiconductor substrate is constructed in a triple well construction for preventing an electrical interference between digital circuits and analog circuits, namely, the construction is made in the manner that deep wells are formed in the semiconductor substrate, and P-wells and N-wells are formed in the deep wells, thereby electrically dividing a digital circuit area and an analog circuit area and driving each of the circuits by an individual power source, that is, an analog circuit power source and a digital circuit power source. Here, a P-type means a conductive type of a semiconductor in which a hole density is larger than a conduction electron density, while an N-type type means a conductive type of a semiconductor in which a conduction electron density is larger than a hole density.

Figure 1A:
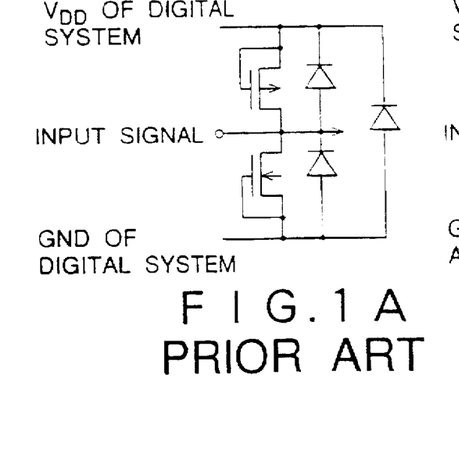
FIGS. 1A and 1B are circuit diagrams respectively showing examples of the conventional ESD protection circuit.
Figure 1B:
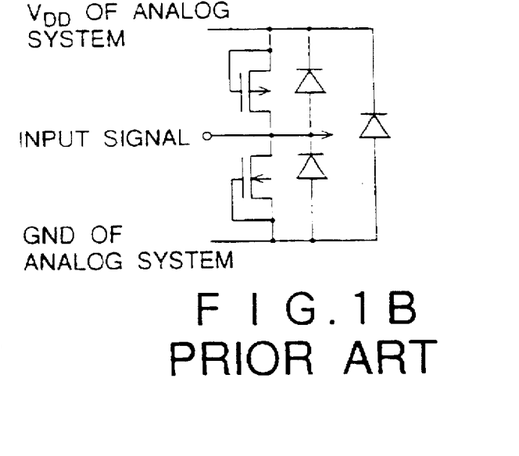

As shown in FIGS. 1A and 1B, an ESD protection circuit is connected to each of input and output terminals of each of the digital circuit and analog circuit for adsorbing a surge voltage by a circuit using diodes. By this, even if the surge voltage mixes with signals between digital power source ($V_{DD}$ and GND) and signal terminals of the digital system and signals between analog power source ($V_{DD}$ and GND) and signal terminals of the analog system, the protection circuits shown in FIGS. 1A and 1B cause charges to be bypassed between the terminals and the power source, thereby avoiding a destruction of an inner circuit not shown in the figure.

However, the ESD circuits shown in FIGS. 1A and 1B function only in the digital circuit or the analog circuit. If the digital power source and the analog power source are completely divided, the surge voltage destroys the inner circuit when the surge voltage invades into a portion between the analog power source and digital circuit system because of not providing a path to let the charges off.

Figure 2:
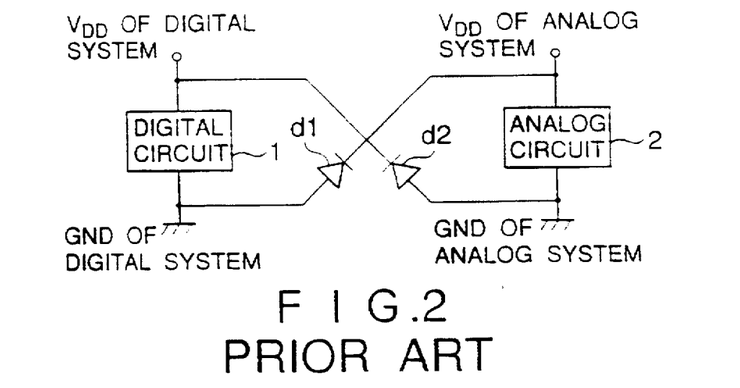
FIG. 2 is a block circuit diagram showing an example of a semiconductor device having the conventional ESD protection circuit.

In order to avoid the above condition, as shown in FIG. 2, there is provided an ESD protection circuit in which a diode d1 is connected between an analog power source $V_{DD}$ (hot; not shown) and a digital system GND (ground), and a diode d2 is connected between a not-shown digital power source $V_{DD}$ and an analog system ground GND in the manner of being a reverse bias. When a surge voltage is supplied between the digital power source $V_{DD}$ and the analog power source GND or between the analog power source $V_{DD}$ and the digital power source GND, the diode d1 or the diode d2 is conducted to bypass the charges for a circuit protection.

Figure 3:
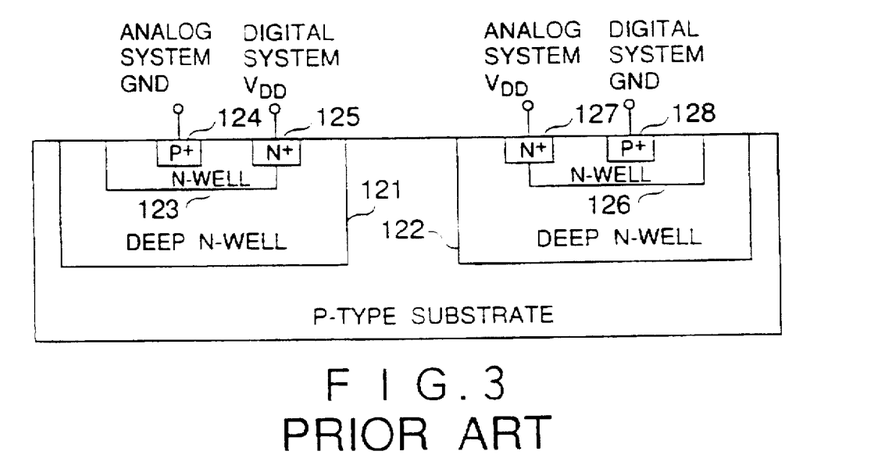
FIG. 3 is a sectional view showing a construction of the conventional semiconductor device.

FIG. 3 shows an example in which the ESD protection circuit (the diodes d1 and d2) shown in FIG. 2 is formed on a semiconductor substrate. In FIG. 3, two deep N-wells 121 and 122 are formed on a P-type substrate so as to form an electrically divided region. For example, the deep N-well 121 corresponds to a digital circuit region and the deep N-well 122 corresponds to an analog circuit region. An N-well 123 is formed in the deep N-well 121, and a P-type high concentration impurity region 124 and an N-type high concentration impurity region 125 are formed in the N-well 123, thereby forming the diode d2. In the same manner, an N-well 126 is formed in the deep N-well 122, and an N-type high concentration impurity region 127 and a P-type high concentration impurity region 128 are formed in the N-well so as to form the diode d1.

However, in the ESD protection circuits shown in FIGS. 2 and 3, the diodes d1 and d2 are in condition of the reverse bias caused by the respective power source of both circuits. The reverse bias causes the diodes d1 and d2 to respectively have an electrode configuration through a depletion layer, thereby functioning as a capacitor. Accordingly, the configuration provided with the ESD protection circuit shown in FIG. 2, is equal to a circuit in which a capacitor is connected between an analog power source $V_{DD}$ and the digital ground GND and a capacitor is connected between a digital power source $V_{DD}$ and an analog ground GND. Since both of the diodes d1 and d2 as a protection diode have a large area, respectively, the capacity of a capacitance is large.

As a result, even though the triple well construction applies for the electrically complete division of the power source of the digital circuit system from the power source of the analog circuit system, it is impossible to divide the power source in an alternating current (AC) circuit because of the capacity of the diode as far as the ESD protection circuit is used. Therefore, there is a problem that a voltage change in the digital power source $V_{DD}$ corresponding to operation of the digital circuit and the like is supplied to the analog ground GND through a diode capacitor, thereby causing a change of the power source voltage of the analog circuit.

SUMMARY OF THE INVENTION

In view of the above-mentioned condition, an object of the present invention is to provide an ESD protection circuit having a little interference between power sources in a semiconductor device having a plurality of circuits which are formed on the same substrate and have the different power source systems.

In order to achieve the above object, a semiconductor device according to the present invention comprises a semiconductor substrate having at least first and second wells which are electrically divided each other, a first electric circuit formed in the first well and connected to a first circuit power source through a power source terminal, a second electric circuit formed in the second well and connected to a second circuit power source through a power source terminal, a substrate ground well formed on the semiconductor substrate and connected to a third circuit power source for supplying a stable reference potential, a first protection diode connected between the power source terminal of the first power source and the substrate ground well in the manner of a reverse bias, and a second protection diode connected between the power source terminal of the second power source and the substrate ground well in the manner of being the reverse bias.

The ground region is formed on the surface of the substrate of the semiconductor device having a plurality of well constructions in which the electric circuits are formed, and is connected to a stable power source (potential) exclusively used for the substrate, thereby stabilizing the ground region to a predetermined potential. The ESD protection circuit is formed between two electric circuits which are respectively formed in different wells and have the respective power sources for connecting both the circuits each other through the protection diode which connects the both the power sources of the electric circuits and the ground region.

As a result, even though a change component of the power source voltage of the digital circuit, which is caused by operation of the digital circuit as one of the electric circuits, reaches the ground region through the capacitor of the protection diode, the power source (ground) which is exclusively used for the substrate absorbs the change component. By this, the power source of the analog circuit as the other electric circuit can obtain a construction which is hard to receive an interference of the digital circuit system through a diode capacitance of the ESD protection circuit.

As described above, in the semiconductor device according to the present invention, since an element having a single direction such as diodes and the like, which is connected between two electric circuits having different power source system, forms a bypass for a surge voltage through a ground region keeping a reference potential at performing an ESD protection, even though a trembling of the voltage of one circuit power source is transmitted by a capacitor of the element having the single direction, the trembling is adsorbed by the ground region, thereby reducing the interference causing the voltage of the other circuit power source to be changed. Furthermore, since the ground region surrounds an environment of a region in which the electric circuit is formed, the electric circuit is shielded from the other electric circuits so as to further reduce an influence of noises.

DETAILED DESCRIPTION OF THE PREFERRED EMBODIMENTS

There will be described in detail an ESD protection circuit according to preferred embodiments of the present invention in reference with the attached drawings.

Figure 4:
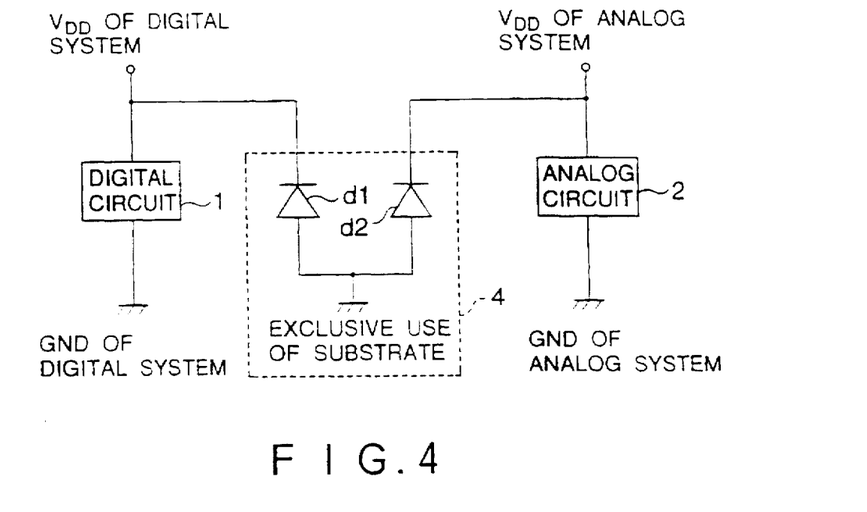
FIG. 4 is a block circuit diagram showing a semiconductor device having an ESD protection circuit according to a first embodiment of the present invention.
Figure 5:
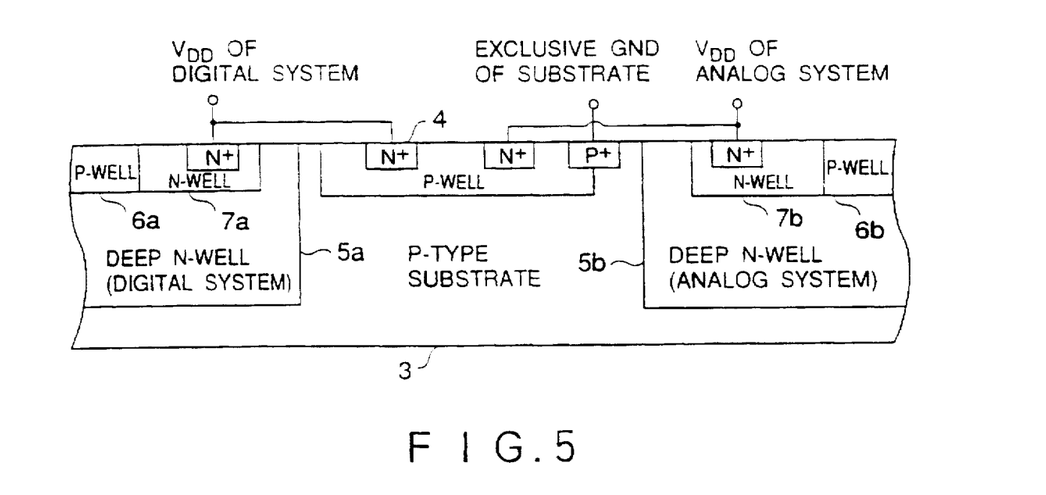
FIG. 5 is a sectional view showing a construction of the semiconductor device according to the first embodiment.

A first embodiment of the present invention is described in reference with FIGS. 4 and 5. In the first embodiment, a digital power source $V_{DD}$ and a digital ground GND are connected to a digital circuit 1 which is formed on a semiconductor substrate, while an analog power source $V_{DD}$ and an analog ground GND are connected to an analog circuit 2 which is also formed on the semiconductor substrate. Furthermore, a ground region 4 exclusively used for the substrate is formed on the semiconductor substrate by means of a well having a conductive type as the same as the semiconductor substrate. The ground region 4 exclusively used for the substrate is independent from ground regions of the digital circuit 1 and analog circuit 2 in order to bias the substrate. It is desired that the ground region 4 may serve as a shield of the analog circuit 2 by means that a well in which the analog circuit is formed, is made around the analog circuit 2. The ground region 4 is connected to a ground power source (not shown) for supplying a stable reference potential GND exclusively used for the substrate.

For example, ESD protection diodes d1 and d2 is provided in the ground region 4. The protection diode d1 is connected between a digital power source $V_{DD}$ (not shown) and a digital ground GND (not shown) exclusively used for the substrate, while the protection diode d2 is connected between an analog power source $V_{DD}$ and an analog ground GND exclusively used for the substrate. Therefore, even though a power source voltage of the digital circuit 1 is changed by operation thereof so as to transmit the trembling of the voltage through a capacitor component of the protection diode d1 to the ground GND exclusively used for the substrate, a potential change is adsorbed in the ground power source. The trembling of the voltage is not transmitted to the analog system power source through the protection diode d2.

Accordingly, the analog circuit system and the digital circuit system are not directly connected by the capacitor of the protection diode in the manner of the conventional example, the analog circuit system is indirectly connected to the digital circuit system in the manner that the trembling of the potential is adsorbed by an existence of the ground region 4 exclusively used for the substrate which is forcibly kept to the reference potential GND by an external power source, for example. Since the ground region 4 of the semiconductor substrate shields an intermediate portion between the analog circuit system and the digital circuit system each other, an interference is extremely little between the analog circuit and the digital circuit.

FIG. 5 shows a construction of the an ESD protection circuit in the semiconductor device, in which an N-type impurity is deeply diffused in the semiconductor substrate 3 so as to form two deep N-wells 5a and 5b. The deep N-well 5a further has a P-well 6b and an N-well 7a to form a digital circuit (not shown) by a complementary metal oxide semiconductor device (CMOS). The N-well 7a is connected to the digital power source $V_{DD}$ (not shown) through a high concentration impurity layer $N^+$. The deep N-well 5b further has a P-well 6a and an N-well 7b to form a digital circuit (not shown) by a complementary metal oxide semiconductor device (CMOS). The N-well 7b is connected to the analog power source $V_{DD}$ (not shown) through a high concentration impurity layer $N^+$. Particular regions in which the digital and analog circuits are respectively formed, are a triple well construction, respectively, which electrically divides both of the digital and analog circuits.

Here, the triple well means a combination of a deep well forming a digital circuit or an analog circuit and a twin well which is formed in the deep well. Since the twin well formed in the deep well can form the C-MOS unless there is not especially the twin well, it is possible to completely divide the digital and analog circuits by a twin well including a deep well and shallow well and the like without the triple well construction. However, it is desired that the triple well construction may be adopted in view of an operation speed of the circuit. Here, a "well" means an island and each of wells or any of wells can be formed by an epitaxial growth.

Two N-type high concentration impurity regions $N^+$ and one P-type high concentration impurity region $P^+$ are formed in a P-well 4 formed on the surface of the P-type substrate 3 which is held between the digital circuit region and the analog circuit region. One of the impurity regions $N^+$ is connected to the digital power source $V_{DD}$, and the other is connected to the analog power source $V_{DD}$. The impurity region $P^+$ is connected through the ground terminal GND exclusively used for the substrate to the ground power source (not shown), and the P-well 4 becomes the ground region 4 mentioned above. The diodes d1 and d2 are formed in the P-well 4 by two impurity regions $N^+$.

Figure 16:
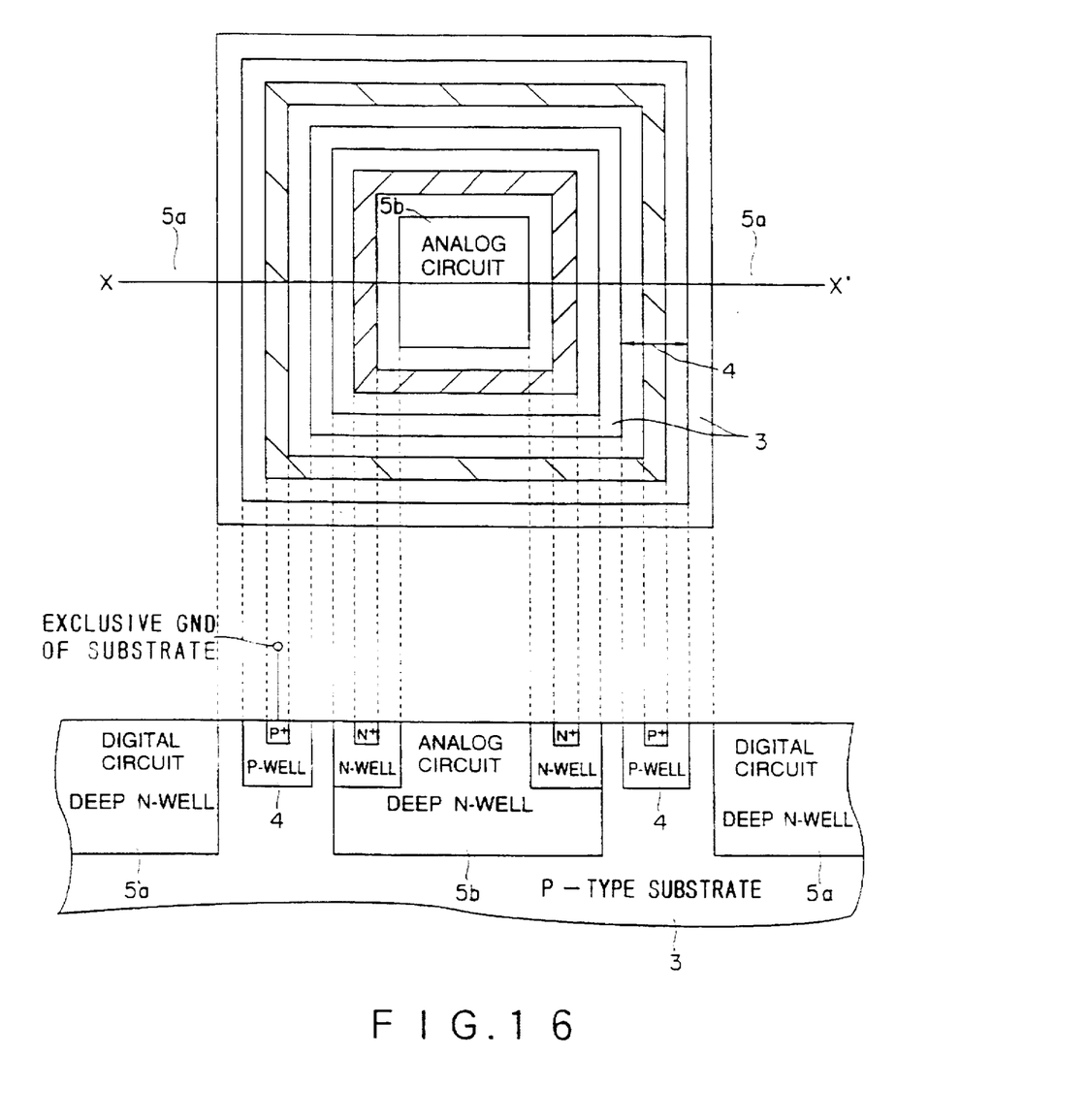
FIG. 16 is a plan view and a corresponding sectional view showing an arrangement and construction of analog and digital circuits according to the eighth embodiment.

As shown in FIG. 16, it is desired that the P-well 4 is formed in the manner of surrounding the deep N-well 5b and that an impurity region $P^+$ is formed inside the P-well 4 so as to shield the analog circuit. Even though it is unnecessary to provide N-wells and $N^+$ regions formed in the deep N-well 5b in the analog circuit, it is ordinary and often to provide the N-wells and $N^+$ regions.

In this manner, in the ESD circuit provided on the ground region which is positioned at an intermediate portion of each regions of the digital circuit system and the analog circuit system, both ends of the diode d1 is clamped at 15 volt because the diode d1 is in the state of the reverse bias, under the condition that a forward direction conductive voltage $V_F$ from diodes d1 to d2 is 0.7 volt, a reverse direction brake down voltage is 15 volt, a positive voltage is added to the digital $V_{DD}$ terminal, and a negative surge voltage is added to the analog $V_{DD}$ terminal. Since the diode d2 is in the state of a forward bias, both ends of the diode d2 is clamped at 0.7 volt.

As a result, when the positive voltage is supplied to the digital power source $V_{DD}$ terminal and the negative surge voltage is supplied to the analog power source $V_{DD}$ terminal, the diodes d1 and d2 form a bypass through which charges passes from the digital power source $V_{DD}$ terminal to the analog power source $V_{DD}$ terminal. A portion between the digital power source $V_{DD}$ terminal and the analog power source $V_{DD}$ terminal is clamped at 15.7 volt, and does not become more than this voltage, thereby obtaining an effect of the ESD protection.

Figure 6:
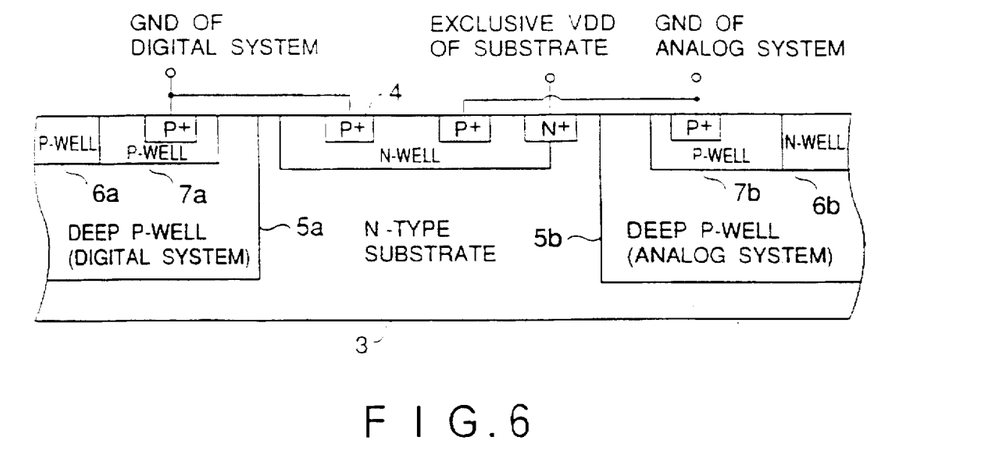
FIG. 6 is a sectional view showing an example in which the semiconductor device according to the first embodiment is formed by an impurity layer having an inverse polarity.

FIG. 6 shows an example in which the deep N-well construction having the P-type substrate shown in FIGS. 4 and 5, is constituted from a deep P-well having an N-type substrate. In FIG. 6, portions corresponding to those in FIG. 5 are attached by the same numerals in FIG. 5 and a detailed description thereof is omitted. Even though a conductive type of the impurity region is inverted, it is of course that the construction in FIG. 6 is the same as that in FIGS. 4 and 5.

Figure 7:
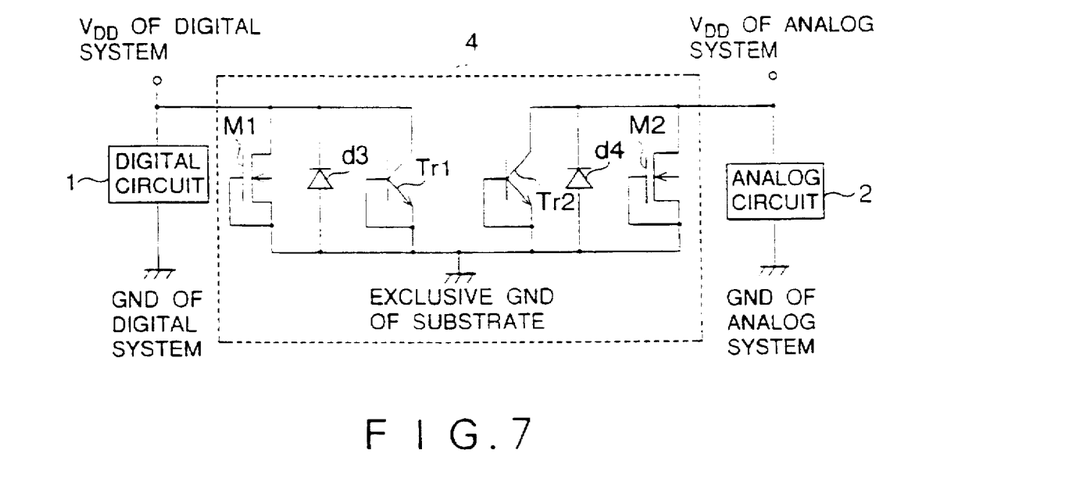
FIG. 7 is a block circuit diagram showing a semiconductor device having an ESD protection circuit according to a second embodiment of the present invention.

FIG. 7 shows a second embodiment according to the present invention. In FIG. 7, portions corresponding to those in FIG. 7 are attached by the same numerals in FIG. 4 and a detailed description thereof is omitted. The construction shown in FIG. 7, has N-MOS transistors M1 and M2 which are connected in a diode connection and in the place of the diodes d1 and d2 shown in FIG. 4. Since the MOS construction is adopted, there are added to the construction parasitic diodes d3 and d4 and parasitic lateral NPN transistors Tr1 and Tr2.

Figure 8:
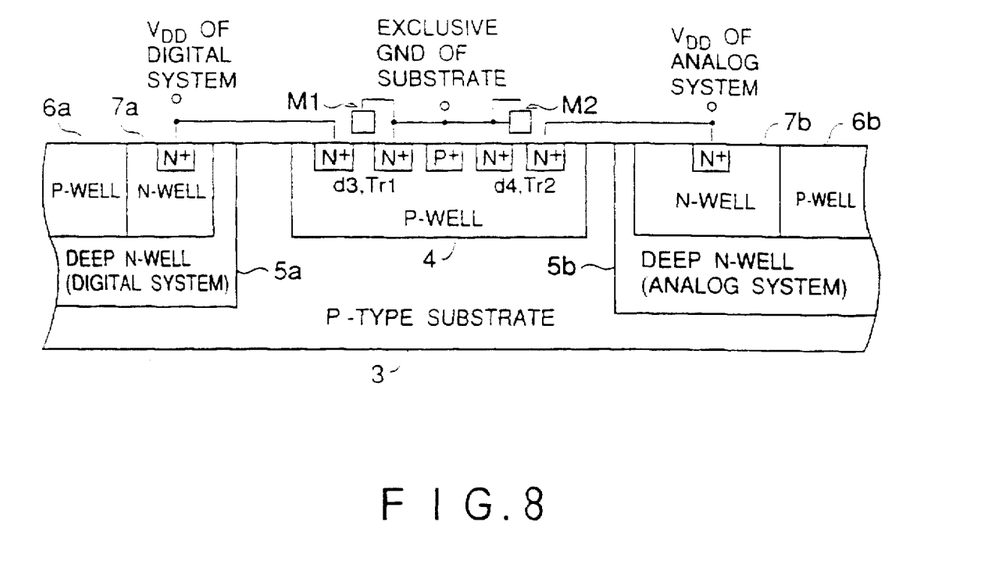
FIG. 8 is a sectional view showing a construction of the semiconductor device according to the second embodiment.

FIG. 8 shows a detailed construction of the ground region 4 exclusively used for the substrate of the semiconductor device according to the second embodiment shown in FIG. 7, in which portions corresponding to those shown in FIG. 5 are attached by the same numerals and the description of these portions are omitted.

In this configuration, when a positive voltage is supplied to the digital power source $V_{DD}$ terminal and a negative surge voltage is supplied to the analog power source $V_{DD}$ terminal, a bypass is formed by the N-MOS transistors M1 and M2, diodes d3 and d4 and NPN transistors Tr1 and Tr2 in order to pass through the charges from the digital power source $V_{DD}$ terminal to the analog power source $V_{DD}$ terminal. Since a portion between the digital power source $V_{DD}$ terminal and the analog power source $V_{DD}$ terminal is clamped to a predetermined voltage, there is an ESD protection effect. Since the ground region 4 of the constant potential GND exists through the bypass route, the analog circuit system is not directly connected with the digital circuit system because of a capacitance of the diodes d3 and d4, thereby reducing an interference between the digital circuit system and the analog circuit system each other. Furthermore, when the ground region 4 surrounds the analog circuit region as described above, the shield is effective.

Figure 9:
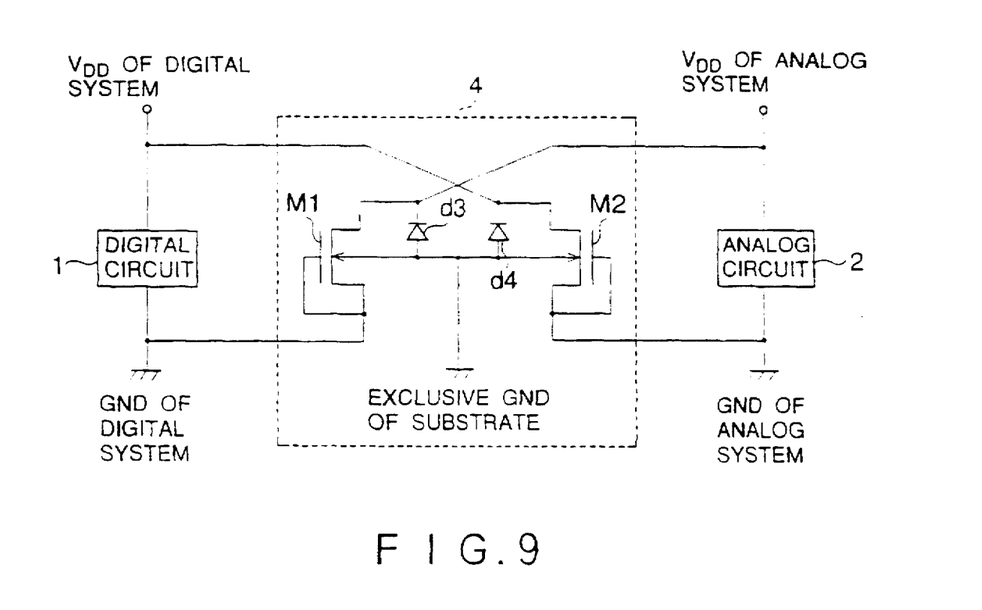
FIG. 9 is a block circuit diagram showing a semiconductor device having an ESD protection circuit according to a third embodiment of the present invention.
Figure 10:
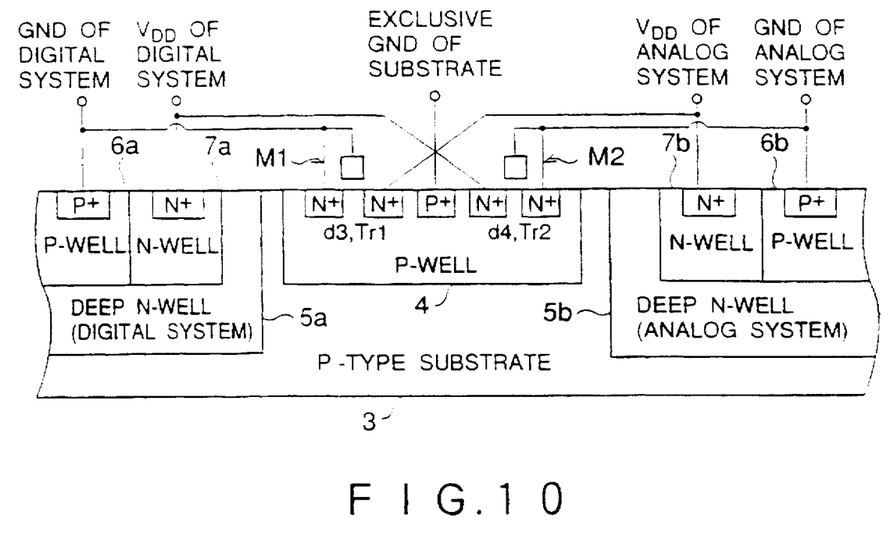
FIG. 10 is a sectional view showing a construction of the semiconductor device according to the third embodiment.

FIG. 9 shows a third embodiment according to the present invention. FIG. 10 shows a detailed construction of an ESD protection circuit which is formed on the ground region 4 exclusively used for the substrate in the third embodiment. In FIG. 10, portions corresponding to those in FIG. 8 are attached as the same numerals in FIG. 8 and the description thereof is omitted.

In this embodiment shown in FIGS. 9 and 10, a P-well 6b is connected to a ground terminal GND of the digital system, and an N-well 7a is connected to a power source $V_{DD}$ terminal of the digital system. A P-well 6a is connected to a ground GND terminal of the analog system, and an N-well 7b is connected to a power source $V_{DD}$ terminal of the analog system. N-MOS transistors M1 and M2 are provided by a diode connection in addition to the diodes d3 and d4 for bypassing a surge voltage which is supplied to a portion between the digital power source $V_{DD}$ terminal and the analog power source $V_{DD}$ terminal. The MOS transistor M1 is connected between the analog power source $V_{DD}$ terminal and the digital ground GND terminal. The MOS transistor M2 is connected between the digital power source $V_{DD}$ terminal and the analog ground GND terminal.

In this configuration, when the surge voltage is inputted into the ESD protection path of the diodes d3 and d4 between the digital $V_{DD}$ terminal and the analog $V_{DD}$ terminal and into a portion between the digital power source $V_{DD}$ terminal and the analog ground GND terminal, the N-MOS transistor M2 provided on the ground region of the substrate forms the bypass route between the digital $V_{DD}$ terminal and the analog system ground GND terminal. Furthermore, when the surge voltage is supplied a portion between the analog power source $V_{DD}$ terminal and the digital ground GND terminal, the N-MOS transistor M1 provided on the ground region of the substrate forms a bypass route between the analog power source $V_{DD}$ terminal and the digital ground GND terminal.

Figure 11:
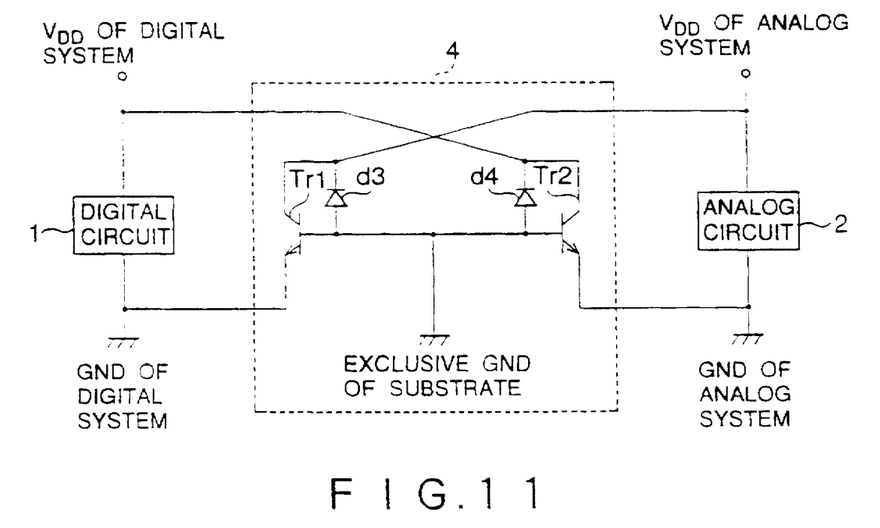
FIG. 11 is a block circuit diagram showing a semiconductor device having an ESD protection circuit according to a fourth embodiment of the present invention.
Figure 12:
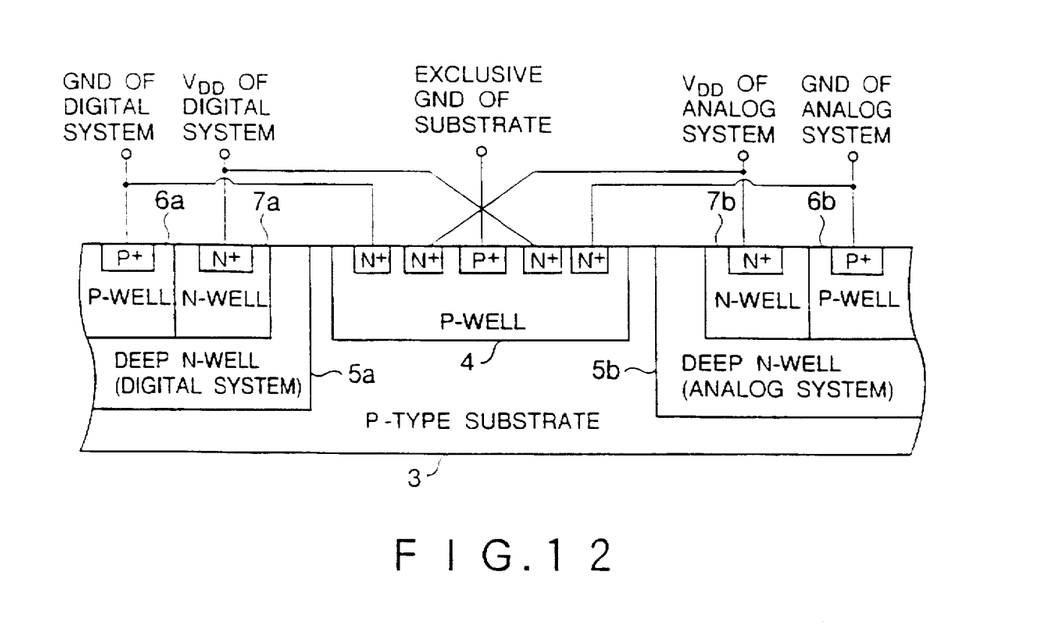
FIG. 12 is a sectional view showing a construction of the semiconductor device according to the fourth embodiment.

FIG. 11 shows a fourth embodiment according to the present invention. FIG. 12 shows a detailed configuration of the ESD protection circuit which is formed on the ground region exclusively used for the substrate of the semiconductor device according to the fourth embodiment.

In this configuration, each of gates of both N-MOS transistors M1 and M2 shown in FIG. 10 is eliminated so as to be a configuration which does not use a MOS transistor. According to this configuration, the parasitic lateral NPN transistors Tr1 and Tr2 shown in FIG. 11 make a bypass corresponding to a surge voltage, which is formed at a portion between a digital power source $V_{DD}$ terminal and an analog ground GND terminal or a portion between an analog power source $V_{DD}$ terminal and a digital ground GND terminal. Therefore, this configuration can also obtain a construction having little interference between the digital circuit system and the analog circuit system by the protection effect against the ESD circuit.

Figure 13:
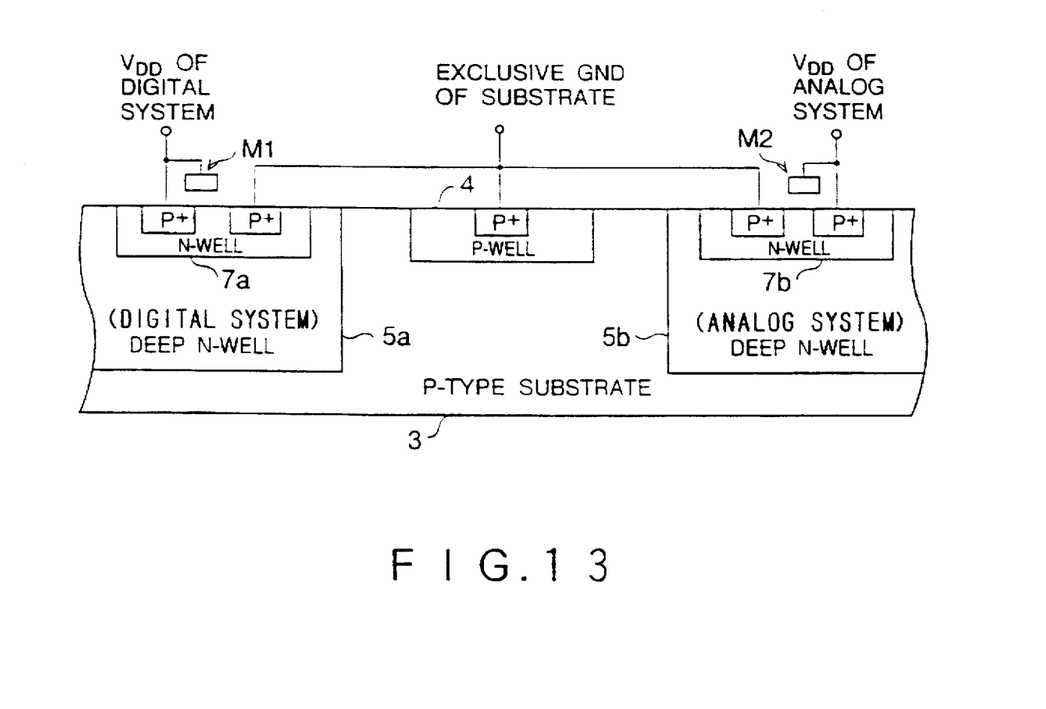
FIG. 13 is a sectional view showing a construction of the semiconductor device according to the fifth embodiment.

FIG. 13 shows a fifth embodiment according to the present invention. In FIG. 13, a protection element is formed on the side of the circuit region and is not formed on the side of the ground region by the MOS transistors M1 and M2 which are connected by a diode connection. This configuration can provide an effect as the same as the above-mentioned embodiments.

It is desired to form a power source to be an external power source or on the same semiconductor substrate, for example, a power source is to supply digital system power sources $V_{DD}$ and GND, to supply analog system power sources $V_{DD}$ and GND, and to supply s reference potential to the ground region.

Figure 14:
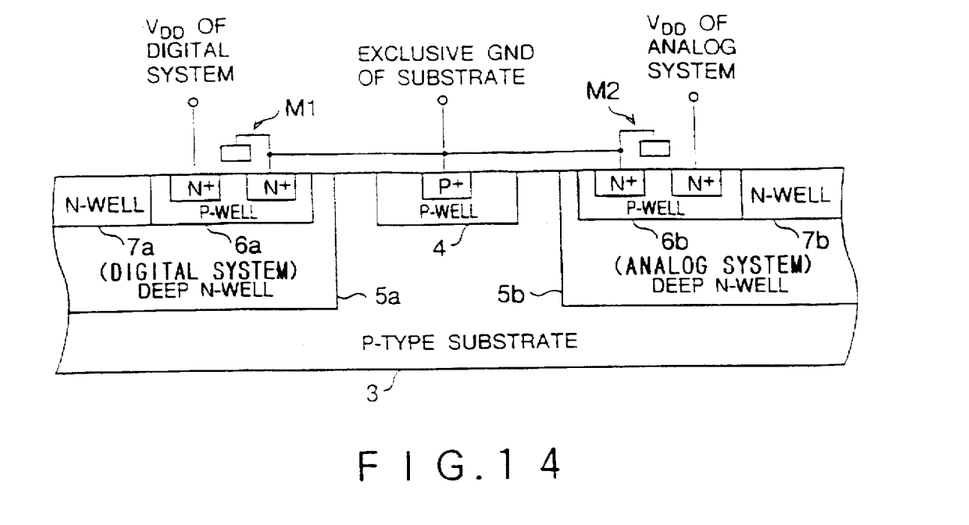
FIG. 14 is a sectional view showing a construction of the semiconductor device according to the sixth embodiment.

In the above fifth embodiment, the MOS transistors M1 and M2 as the protecting elements are provided on the side of the circuit region and the power source terminal, in which the triple well construction as a detailed configuration is not shown in FIG. 13. However, in a semiconductor device according to a sixth embodiment shown in FIG. 14, P-wells 6b and 6a and N-wells 7a and 7b may be formed in the deep N-wells 5a and 5b respectively forming digital and analog circuits, thereby forming the triple well construction. In respective P-wells 6b and 6b, there are formed high concentration impurity regions $N^+$ through which a digital system power source $V_{DD}$ and an analog system power source $V_{DD}$ are respectively connected. Furthermore, there are also provided high concentration impurity regions $N^+$ different from the above-mentioned high concentration impurity regions $N^+$, through which an exclusive ground GND of a substrate is connected, respectively. The MOS transistors M1 and M2 are provided within the digital or analog element region, respectively, each of which is connected at a connection line between the high concentration impurity region $N^+$ and the exclusive ground GND of the substrate.

Figure 15:
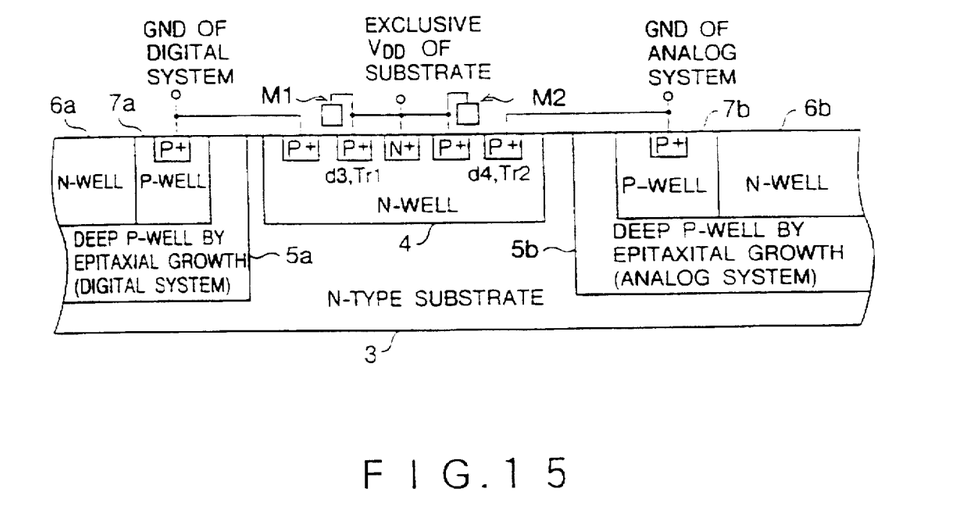
FIG. 15 is a sectional view showing a construction of the semiconductor device according to a seventh embodiment.

Furthermore, the semiconductor device according to the first through sixth embodiments may have the construction that deep P-well regions 5a and 5b are formed on an N-type substrate, and an analog circuit and a digital circuit each having a triple well construction are formed in the deep well regions 5a and 5b FIG. 15 shows a semiconductor device according to a seventh embodiment as a concrete example of the P-type substrate. In FIG. 15, a conductive type of N or P is opposite to the conductive type of the second embodiment shown in FIG. 8. In this connection, the power sources $V_{DD}$ of the digital and analog systems shown in FIG. 8 change to digital and analog grounds GND in FIG. 15, respectively, while the exclusive ground GND of the substrate shown in FIG. 8 corresponds to an exclusive power source $V_{DD}$ of a substrate. Accordingly, numeral 4 denotes an exclusive power source region of the substrate. Deep P-wells 5a and 5b are formed in the manner that a predetermined grooves are formed in the substrate 3 by etching, and deep wells are grown in the grooves by an epitaxial growth. The device according to the seventh embodiment has conductive types opposite to those in the third embodiment shown in FIG. 8, and devices according to the first and third through sixth embodiments may have the conductive type opposite to those in several embodiments.

Even though the above-mentioned embodiments only show sectional views or circuit diagrams of the semiconductor devices, a plan view is shown on an upper side of FIG. 16 showing a eighth embodiment, corresponding to the sectional view of the semiconductor device shown on lower side of FIG. 16.

An entire circuit shape of the semiconductor device can be thought in various types, the semiconductor device according to the eighth embodiment has a construction, as shown at the upper portion in FIG. 16, that there are a square analog circuit region, a substrate ground region surrounding the analog circuit, and a digital circuit region further surrounding the substrate ground region. A section is shown at lower side in FIG. 16 by cutting the semiconductor device having such a plane shape along an X—X' line.

As has been easily understood at a view of the section, even though digital circuits are formed in deep N-wells 5a and 5a at both sides on the substrate 3 and an analog circuit is formed in a deep N-well 5b at substantially the center of the substrate, a detail description will be omitted. A substrate ground region 4 is formed by surrounding the deep N-well at the center and being surrounded by the deep N-well outer periphery side. Furthermore, an exclusive ground GND of the substrate is connected to any portion of the substrate ground region 4.

What is claimed is:

1. A semiconductor device comprising:
    a semiconductor substrate having at least a first well and a second well which are electrically divided from each other;
    a first electric circuit formed in said first well and connected to a first circuit power source through a source terminal;
    a second electric circuit formed in said second well and connected to a second circuit power source through a source terminal;
    a substrate ground well formed on said semiconductor substrate and connected to a third circuit power source which outputs a stable reference potential;
    a first protection diode connected between said source terminal of said first power source and said substrate ground well in the manner of being a reverse bias direction; and
    a second protection diode connected between said source terminal of said second power source and said substrate ground well in the manner of being a reverse direction;

whereby interference between said first and second power sources is prevented by said first and second protection diodes;

wherein said first protection diode and/or said second protection diode comprises or respectively comprise any or combination of a diode, bipolar transistors which are connected with each other in a diode connection, and metal oxide layer semiconductor (MOS) transistors which are connected with each other in a diode connection.

2. A semiconductor device comprising:

a semiconductor substrate having at least a first well and a second well which are electrically divided from each other;

a first electric circuit formed in said first well and connected to a first circuit power source through a source terminal;

a second electric circuit formed in said second well and connected to a second circuit power source through a source terminal;

a substrate ground well formed on said semiconductor substrate and connected to a third circuit power source which outputs a stable reference potential;

a first protection diode connected between said source terminal of said first power source and said substrate ground well in the manner of being a reverse bias direction; and a second protection diode connected between said source terminal of said second power source and said substrate ground well in the manner of being a reverse direction;

whereby interference between said first and second power sources is prevented by said first and second protection diodes;

a semiconductor substrate formed from a P-type semiconductor in which a hole density is larger than a conduction electron density;

a digital circuit as said first electric circuit provided in a first deep N-well formed on said semiconductor substrate by an N-type high concentration semiconductor in which a conduction electron density is larger than a hole density, and said digital circuit being connected through said power source terminal to a digital circuit power source;

an analog circuit as said second electric circuit provided with electrically insulated to said digital circuit in a second deep N-well formed on said semiconductor substrate by said N-type high concentration semiconductor, and said analog circuit being connected through said power source terminal to an analog circuit power source;

a substrate grounding first P-well formed by said P-type semiconductor on said semiconductor substrate for grounding and being connected through a ground terminal exclusively using for said substrate to said third circuit power source for adding a stable reference potential;

said first protection diode connected between said power source terminal of said digital circuit power source and said substrate grounding first P-well in the manner of making a reverse bias; and said said second protection diode connected between said power source terminal of said analog circuit power source and said substrate grounding first P-well in the manner of making a reverse bias.

3. A semiconductor device comprising:

a semiconductor substrate having at least a first well and a second well which are electrically divided from each other;

first electric circuit formed in said first well and connected to a first circuit power source through a source terminal;

a second electric circuit formed in said second well and connected to a second circuit power source through a source terminal;

a substrate ground well formed on said semiconductor substrate and connected to a third circuit power source which outputs a stable reference potential;

a first protection diode connected between said source terminal of said first power source and said substrate ground well in the manner of being a reverse bias direction; and a second protection diode connected between said source terminal of said second power source and said substrate ground well in the manner of being a reverse direction;

whereby interference between said first and second power sources is prevented by said first and second protection diodes;

a semiconductor substrate formed from an N-type semiconductor in which a conduction electron density is larger than a hole density;

a digital circuit as said first electric circuit provided in a second deep P-well formed on said semiconductor substrate by a P-type high concentration semiconductor in which a hole density is larger than a conduction electron density, and said digital circuit being connected through said power source terminal to a digital circuit ground;

an analog circuit as said second electric circuit provided with electrically insulated to said digital circuit in a third deep P-well formed on said semiconductor substrate by said P-type high concentration semiconductor, and said analog circuit being connected through said power source terminal to an analog circuit ground;

a substrate grounding third N-well formed by said N-type semiconductor on said semiconductor substrate for grounding and being connected through a ground terminal exclusively using for said substrate to said third circuit power source for adding a stable reference potential;

said first protection diode connected between said power source terminal of said digital circuit power source and said substrate grounding third N-well in the manner of making a reverse bias; and said second protection diode connected between said power source terminal of said analog circuit power source and said substrate grounding third N-well in the manner of making a reverse bias.

4. The semiconductor device according to claim 1: wherein at least any of said first well, said second well, said deep well and said substrate ground well is formed by an epitaxial growth.

5. The semiconductor device according to claim 2: wherein said substrate grounding first P-well has two $N^+$ regions which are made of a high concentration N-type semiconductor, one of which is connected in parallel to a connection line between said digital circuit power

11 source and said digital circuit so to be said first protection diode, and the other of which is connected in parallel to a connection line between said analog circuit power source and said analog circuit so as to be said second protection diode.

6. The semiconductor device according to claim 2: wherein said substrate grounding first P-well has to fourth $N^+$ regions formed by said high concentration N-type semiconductor, said first $N^+$ region is connected in parallel to a connection line between said digital circuit power source and said digital circuit, said second $N^+$ region is connected in parallel to a connection line between said analog circuit power source and said analog circuit, said third $N^+$ region is connected a first MOS transistor, and said fourth $N^+$ region is connected to a second MOS transistor; and wherein a first diode element and a first bipolar transistor constructed by said first and third $N^+$ regions and said first MOS transistor function as said first protection diode, and a second diode element and a second bipolar transistor constructed by said second and fourth $N^+$ regions and said second MOS transistor function as said protection diode.

7. The semiconductor device according to claim 2: wherein said substrate grounding first P-well has fifth to eighth $N^+$ regions formed by said high concentration N-type semiconductor, said fifth $N^+$ region is connected in parallel to a connection line between said digital circuit and said digital circuit so as to form a third bipolar transistor, said sixth $N^+$ region is connected in parallel to a ground so as to form a fourth bipolar transistor, said seventh $N^+$ region is connected in parallel to a connection line between said analog circuit and analog power source so as to form a third diode element, and said eighth $N^+$ region is connected to a connection line between said digital circuit and digital power source so as to form a fourth diode element; and wherein said third bipolar transistor and said diode element function as said first protection diode, and a fourth bipolar transistor and fourth diode element function as said second protection diode.

8. The semiconductor device according to claim 2: wherein said substrate grounding first P-well has fifth to eighth $N^+$ regions formed by said high concentration N-type semiconductor, said fifth $N^+$ region is connected in parallel to a connection line between said digital circuit and said digital circuit and also connected to a third MOS transistor, said sixth $N^+$ region is connected in parallel to a connection line between said analog circuit and said analog ground and also connected to a fourth MOS transistor, said seventh $N^+$ region is connected in parallel to a connection line between said analog circuit and analog power source so as to form a third diode element, and said eighth $N^+$ region is connected in parallel to a connection line between said digital circuit and digital power source so as to form a fourth diode element; and wherein said third MOS transistor and said third diode element function as said first protection diode, and a fourth MOS transistor and said fourth diode element function as said second protection diode.

9. The semiconductor device according to claim 2: wherein a first MOS transistor functioning as said first protection diode is connected in the manner of making a reverse

12 bias in parallel to a connection line between said digital circuit power source and a $P^+$ region which is formed through an N-well on said first deep N-well including said digital circuit; and a second MOS transistor functioning as said second protection diode is connected in the manner of making a reverse bias in parallel to a connection line between said analog circuit power source and a $P^+$ region which is formed through an N-well on said deep N-well including said analog circuit.

10. The semiconductor device according to claim 2: wherein a first MOS transistor is connected in the manner of making a reverse bias in parallel to a connection line between said substrate grounding P-well and an $N^+$ region which is formed trough a P-well in said first deep N-well in which said digital circuit is formed, and said first MOS transistor functions as said first protection diode; and a second MOS transistor is connected in the manner of making a reverse bias in parallel to a connection line between said substrate grounding P-well and an $N^+$ region which is formed through a P-well in said second deep N-well in which said analog circuit is formed, and second MOS transistor functions as second protection diode.

11. The semiconductor device according to claim 2: wherein said second deep N-well for said analog circuit is formed in a square shape in a plan view at the center portion of said P-type substrate, said substrate grounding P-well is formed around said analog circuit, and said first deep N-well for said digital circuit is formed further around said substrate grounding P-well.

12. The semiconductor device according to claim 3: wherein two $P^+$ regions is made of a high concentration p-type semiconductor on a substrate grounding third N-well, one of which is connected in parallel to a connection line between said digital circuit power source and said digital circuit so as to form said first protection diode, the other of which is connected in parallel to a connection line between said analog circuit power source and said analog circuit so as to form said second protection diode.

13. The semiconductor device according to claim 3, wherein said substrate grounding third N-well has first to fourth $P^+$ regions formed by a high concentration P-type semiconductor, said first $P^+$ region is connected in parallel to a connection line between said digital circuit and said digital ground, said second $P^+$ region is connected in parallel to a connection line between said analog circuit and said analog ground, said third $P^+$ region is connected to a first MOS transistor, and said fourth $P^+$ region is connected to a second MOS transistor; and wherein a first diode element and a first bipolar transistor constructed from said first and third $P^+$ regions and said first MOS transistor function as said first protection diode, and a second diode element and a second bipolar transistor constructed from said second and fourth $P^+$ regions and said second MOS transistor function as said second protection diode.

* * * * *